(12) United States Patent
Lee et al.

(10) Patent No.: US 10,978,356 B2
(45) Date of Patent: Apr. 13, 2021

(54) TRI-LAYER STI LINER FOR NANOSHEET LEAKAGE CONTROL

(71) Applicant: International Business Machines Corporation, Armonk, NY (US)

(72) Inventors: Choonghyun Lee, Rensselaer, NY (US); Xin Miao, Slingerlands, NY (US); Alexander Reznicek, Troy, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/408,799

(22) Filed: May 10, 2019

(65) Prior Publication Data

US 2020/0357703 A1 Nov. 12, 2020

(51) Int. Cl.
*H01L 21/02* (2006.01)
*H01L 21/8238* (2006.01)
(Continued)

(52) U.S. Cl.
CPC .......... *H01L 21/823821* (2013.01); *H01L 21/02532* (2013.01); *H01L 21/02603* (2013.01); *H01L 21/76224* (2013.01); *H01L 21/76832* (2013.01); *H01L 21/823807* (2013.01); *H01L 21/823828* (2013.01); *H01L 21/823864* (2013.01); *H01L 21/823878* (2013.01); *H01L 27/0924* (2013.01); *H01L 29/161* (2013.01); *H01L 29/66545* (2013.01); *H01L 29/66795* (2013.01); *H01L 29/785* (2013.01)

(58) Field of Classification Search
CPC ......... H01L 21/823821; H01L 27/0924; H01L 29/161; H01L 29/66545; H01L 29/66795; H01L 29/785
USPC .......................................... 438/590; 257/368
See application file for complete search history.

(56) References Cited

U.S. PATENT DOCUMENTS

2009/0321820 A1* 12/2009 Yamakawa ......... H01L 29/7834
257/330
2009/0325359 A1    12/2009 Liu
(Continued)

OTHER PUBLICATIONS

"III V Nano Sheet Process Flow", An IP.com Prior Art Database Technical Disclosure, Disclosed Anonymously, IP.com No. IPCOM000247368D, IP.com Electronic Publication Date: Aug. 29, 2016, 7 pages.
(Continued)

*Primary Examiner* — Long K Tran
(74) *Attorney, Agent, or Firm* — Michael A. Petrocelli (57) ABSTRACT

A method of forming a semiconductor structure includes forming a recess within a semiconductor substrate, the recess is located between adjacent fins of a plurality of fins on the semiconductor substrate, forming a first liner above a perimeter including the recess, top surfaces of the semiconductor substrate, and top surfaces and sidewalls of the plurality of fins, the first liner includes a first oxide material, forming a second liner directly above the first liner, and forming a third liner directly above the second liner, the third liner includes a nitride material, the second liner includes a second oxide material capable of creating a dipole effect that neutralizes positive charges generated within the third liner and between the third liner and the first liner.

9 Claims, 6 Drawing Sheets

(51) Int. Cl.
    *H01L 21/762*    (2006.01)
    *H01L 21/768*    (2006.01)
    *H01L 29/161*    (2006.01)
    *H01L 29/78*    (2006.01)
    *H01L 29/66*    (2006.01)
    *H01L 27/092*    (2006.01)

(56) References Cited

U.S. PATENT DOCUMENTS

| | | | |
|---|---|---|---|
| 2015/0123167 A1* | 5/2015 | Ji | H01L 27/0922 257/192 |
| 2017/0125408 A1 | 5/2017 | Park | |
| 2017/0330802 A1* | 11/2017 | Ok | H01L 29/517 |
| 2018/0122899 A1 | 5/2018 | Guillorn | |
| 2018/0166352 A1 | 6/2018 | Choi | |
| 2018/0233572 A1 | 8/2018 | Cheng | |
| 2018/0315664 A1 | 11/2018 | Cheng | |
| 2020/0051981 A1* | 2/2020 | Yang | H01L 27/092 |

OTHER PUBLICATIONS

Kita, et al., "Intrinsic Origin of Electric Dipoles Formed at High-k/SiO2 Interface", 2008 IEEE International Electron Devices Meeting, Dec. 15-17, 2008, 4 pages, <https://ieeexplore.ieee.org/document/4796605>.

Litta, et al., "Threshold voltage control in TmSiO/HfO2 high-k/metal gate MOSFETs", Solid-State Electronics 108 (2015), pp. 24-29.

* cited by examiner

TRI-LAYER STI LINER FOR NANOSHEET LEAKAGE CONTROL

BACKGROUND

The present invention generally relates to the field of complementary metal-oxide semiconductor (CMOS) devices, and more particularly to nanosheet field effect transistor devices having a tri-layer shallow trench isolation (STI) liner for reducing sub-sheet leakage.

In contemporary semiconductor device fabrication processes a large number of semiconductor devices, such as field effect transistors (FETs), are fabricated on a single wafer. Some non-planar device architectures, including nanosheet FETs, provide increased device density and increased performance over planar devices. In nanosheet FETs, in contrast to conventional FETs, the gate stack wraps around the full perimeter of each nanosheet, enabling fuller depletion in the channel region, and reducing short-channel effects. The wrap-around gate structures used in nanosheet devices also enable greater management of leakage current in the active regions, even as drive currents increase.

Nanosheet FETs often include thin alternating layers (nanosheets) of different semiconductor materials arranged in a stack. Typically, nanosheets are patterned into nanosheet fins. Once the nanosheet fins are patterned, a gate stack is formed over a channel region of the nanosheet fins, and source/drain regions are formed adjacent to the gate stack. In some devices, once the gate stack or the source/drain regions have been formed, an etching process is performed to selectively remove nanosheet layers of one of the dissimilar materials from the fins. The etching process results in the undercutting and suspension of the layers of the nanosheet fin to form nanosheets or nanowires. The nanosheets or nanowires can be used to form gate-all-around devices.

SUMMARY

According to an embodiment of the present disclosure, a method of forming a semiconductor structure includes forming a recess within a semiconductor substrate, the recess is located between adjacent fins of a plurality of fins on the semiconductor substrate, forming a first liner above a perimeter including the recess, top surfaces of the semiconductor substrate, and top surfaces and sidewalls of the plurality of fins, the first liner including a first oxide material, forming a second liner directly above the first liner, and forming a third liner directly above the second liner, the third liner including a nitride material, the second liner includes a second oxide material capable of creating a dipole effect that neutralizes positive charges generated within the third liner and between the third liner and the first liner.

According to another embodiment of the present disclosure, a method of forming a semiconductor structure includes epitaxially growing a nanosheet stack on a semiconductor substrate, the nanosheet stack including an alternating sequence of a first nanosheet including silicon and a second nanosheet including silicon germanium, etching the nanosheet stack to form a plurality of fins, a recess is formed in the semiconductor substrate adjacent to the plurality of fins during the etching of the nanosheet stack, depositing a first liner above a perimeter including the recess, top surfaces of the semiconductor substrate, and top surfaces and sidewalls of the plurality of fins, the first liner including a first oxide material, depositing a second liner directly above the first liner, depositing a third liner directly above the second liner, the third liner including a nitride material, the second liner includes a second oxide material capable of creating a dipole effect that neutralizes positive charges generated within the third liner and between the third liner and the first liner, depositing a dielectric material above the third liner, the dielectric material substantially fills the recess, and sequentially removing the dielectric material, the first liner, the second liner and the third liner from the top surfaces and sidewalls of the plurality of fins, where remaining portions of the dielectric material, the first liner, the second liner and the third liner fills the recess to form a shallow trench isolation region in the semiconductor substrate.

According to another embodiment of the present disclosure, a semiconductor structure includes a plurality of fins on a semiconductor substrate, the plurality of fins including an alternating sequence of a first nanosheet including epitaxially grown silicon and a second nanosheet including epitaxially grown silicon germanium, and a shallow trench isolation region within the semiconductor substrate adjacent to the plurality of fins, the shallow trench isolation region including a recess within the substrate filled with a first liner, a second liner directly above the first liner, a third liner directly above the second liner, and a dielectric material directly above the third liner, the first liner includes a first oxide material, the third liner includes a nitride material, and the second liner includes a second oxide material capable of creating a dipole effect that neutralizes positive charges within the third liner and between the third liner and the first liner.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

It is understood that although the disclosed embodiments include a detailed description of an exemplary nanosheet FET architecture having silicon and silicon germanium nanosheets, implementation of the teachings recited herein are not limited to the particular FET architecture described herein. Rather, embodiments of the present invention are capable of being implemented in conjunction with any other type of FET device now known or later developed.

As integrated circuit fabrication continues to strive to produce smaller and denser integrated circuits, a viable alternative for 5 nm node technology includes nanosheet FETs. As previously described, the gate stack in nanosheet FETs wraps around the full perimeter of each nanosheet, enabling fuller depletion in the channel region, and reducing short-channel effects, among other benefits. This allows an increased device density and an increased performance over planar devices.

Isolation is an important and integral part of complementary metal-oxide semiconductor (CMOS) design and manufacturing. Isolation regions perform the important function of preventing the unwanted electrical coupling between adjacent parts of a transistor and between transistors. A dielectric isolation process commonly used in CMOS fabrication is shallow trench isolation (STI). STI is particularly attractive for applications requiring high circuit density, such as nanosheet FETs, due to its ability to independently shrink the horizontal isolation dimension.

During fabrication of nanosheet FETs, a nitride liner is typically formed over the nanosheet stack to protect (dummy or sacrificial) silicon germanium layers from being oxidized during formation of STI regions in the semiconductor substrate. More specifically, the nitride liner prevents silicon germanium layers from being oxidized during formation of STI regions in both n-type and p-type nanosheet FETs. Thus, STI regions in current process of record (POR), include a bi-layer STI liner composed of the nitride liner and an underlying oxide liner. The underlying oxide liner provides a good interface between semiconductor fins and the nitride liner. Experimental results have shown the formation of positive charges within the nitride liner and at an interface between the nitride liner and the underlying oxide liner causes substantial sub-sheet leakage in n-type nanosheet FETs. This parasitic charge within the nitride liner and between the nitride liner and the oxide liner distorts current-voltage behavior, negatively affecting overall performance and reliability of nanosheet FETs.

Aluminum oxide ($Al_2O_3$) is known to generate a dipole effect (i.e., separation of positive and negative electrical charges) when put in contact with oxide materials, such as silicon dioxide. Accordingly, by forming an aluminum oxide liner between the oxide and nitride liners, the positive parasitic charges can be neutralized, thereby reducing the sub-sheet leakage in n-type nanosheet FETs, without increasing the sub-sheet leakage in p-type nanosheet FETs.

Therefore, embodiments of the present disclosure provide a method and structure for reducing sub-sheet leakage in n-type nanosheet FETs that cancels or counteracts positive electrical charges formed within the nitride liner and at the interface between nitride and oxide liners typically used during formation of STI regions, without increasing sub-sheet leakage in p-type nanosheet FETs.

The present invention generally relates to the field of CMOS devices, and more particularly to nanosheet FET devices having a tri-layer STI liner for reducing sub-sheet leakage. One way to reduce sub-sheet leakage in nanosheet FETs includes forming, in a STI region, an aluminum oxide layer between an oxide layer and a nitride layer. One embodiment by which the aluminum oxide layer can be formed is described in detailed below by referring to the accompanying drawings in FIGS. 1-8A.

Figure 1:
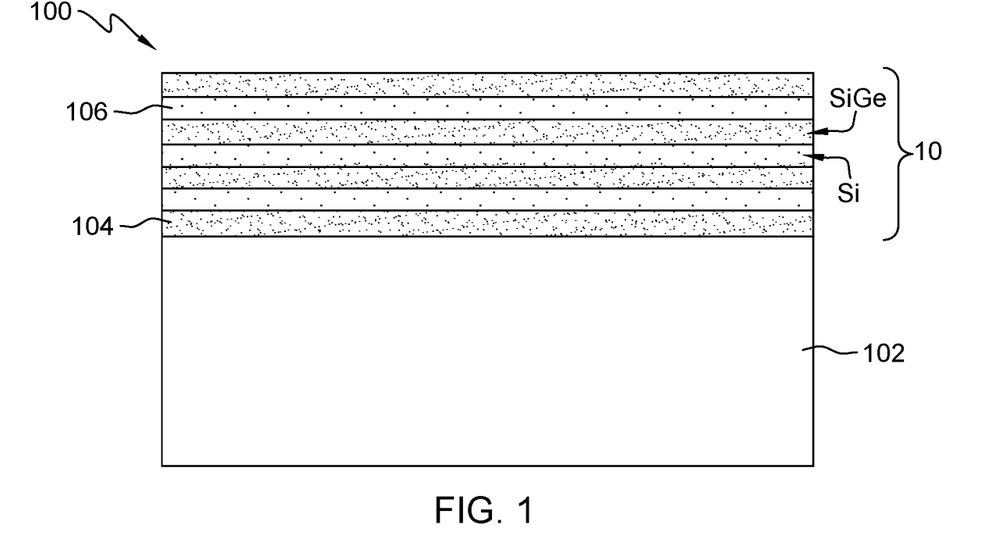
FIG. 1 is a cross-sectional view of a semiconductor structure depicting a nanosheet stack formed over a semiconductor substrate, according to an embodiment of the present disclosure.

Referring now to FIG. 1, a cross-sectional view of a semiconductor structure 100 including a nanosheet stack 10 formed over a semiconductor substrate 102 is shown, according to an embodiment of the present disclosure. In this embodiment, first nanosheets 104 and second nanosheets 106 are formed on the semiconductor substrate 102 during an intermediate operation of fabricating a semiconductor device.

The first and second nanosheets 104, 106 are vertically-stacked over the semiconductor substrate 102 in an alternating fashion forming the nanosheet stack 10, as shown in the figure. Specifically, the first nanosheets 104 including or made of a thin layer of a first semiconductor material alternate with the second nanosheets 106 including or made of a thin layer of a second semiconductor material.

For illustration purposes only, reference is made to operations performed on and to a nanosheet stack 10 having four first nanosheets 104 alternating with three second nanosheets 106. It is understood, however, that the nanosheet stack 10 can include any number of nanosheets. For example, the nanosheet stack 10 can include a single nanosheet, two nanosheets, five nanosheets, eight nanosheets, or any number of nanosheets.

According to an embodiment, the semiconductor substrate 102 may include any suitable substrate material, such as, for example, monocrystalline Si, SiGe, silicon carbide (SiC), III-V compound semiconductor, II-VI compound semiconductor, or semiconductor-on-insulator (SOI). In some embodiments, the semiconductor substrate 102 may include a buried oxide layer (not depicted).

The first nanosheets 104 may include any suitable material such as, for example, monocrystalline silicon (Si) or silicon germanium (SiGe). In this embodiment, the first nanosheets 104 are made of silicon germanium. The germanium concentration (atomic concentration) in the first nanosheets 104 ranges from approximately 10% to approximately 70% and more preferably from approximately 20% to approximately 50%. In some embodiments, the first nanosheets 104 have a thickness of approximately 5 nm to approximately 30 nm, although other thicknesses are within the contemplated scope of the invention.

Similarly, the second nanosheets 106 may include any suitable material such as, for example, monocrystalline silicon or silicon germanium. In embodiments in which the first nanosheets 104 are made of silicon, the second nanosheets 106 are made of silicon germanium, and vice versa. In this embodiment, since the first nanosheets 104 include silicon germanium, the second nanosheets 106 are made of silicon, as illustrated in the figure. In some embodiments, the second nanosheets 106 have a thickness of approximately 3 nm to approximately 15 nm, although other thicknesses are within the contemplated scope of the invention.

The nanosheet stack 10 (e.g., SiGe/Si stack) formed by the alternating sequence of first and second nanosheets 104, 106 can be formed by epitaxial growth by using the semiconductor substrate 102 as the seed layer. Terms such as "epitaxial growth and/or deposition" and "epitaxially formed and/or grown" refer to the growth of a semiconductor material on a deposition surface of a semiconductor material, in which the semiconductor material being grown has the same or substantially similar crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same or substantially similar crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Non-limiting examples of various epitaxial growth processes include rapid thermal chemical vapor deposition (RTCVD), low-energy plasma deposition (LEPD), ultra-high vacuum chemical vapor deposition (UHVCVD), atmospheric pressure chemical vapor deposition (APCVD), metalorganic chemical vapor deposition (MOCVD), low-pressure chemical vapor deposition (LPCVD), limited reaction processing CVD (LRPCVD), and molecular beam epitaxy (MBE). The temperature for an epitaxial deposition process can range from 500° C. to 900° C. Although higher temperatures typically results in faster deposition, the faster deposition may result in crystal defects and film cracking.

A number of different precursors may be used for the epitaxial growth of the first and second nanosheets 104, 106. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 2:
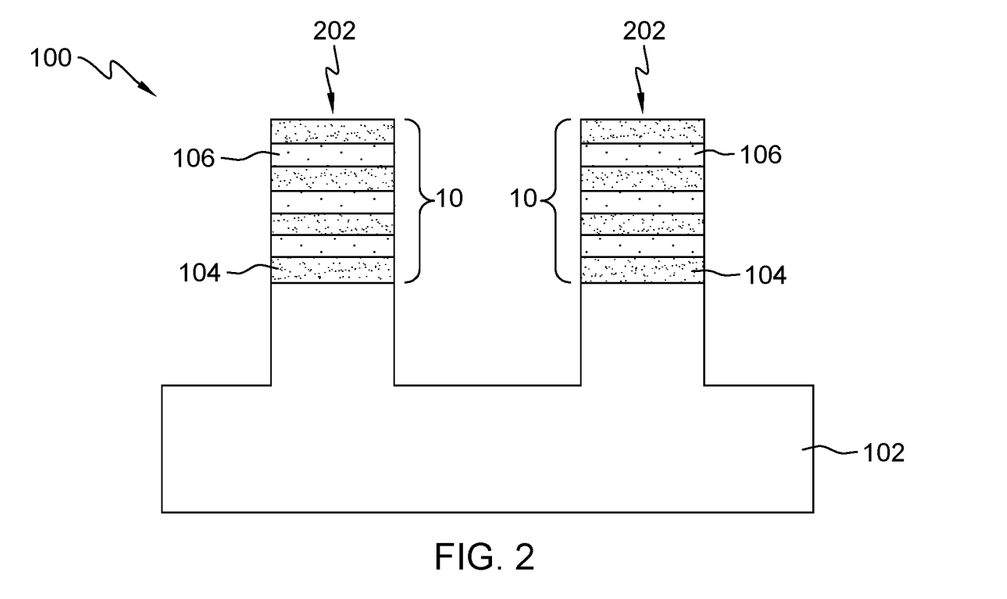
FIG. 2 is a cross-sectional view of the semiconductor structure following the patterning of fins from the nanosheet stack, according to an embodiment of the present disclosure.

Referring now to FIG. 2, a cross-sectional view of the semiconductor structure 100 is shown following the patterning of fins 202 from the nanosheet stack 10 (FIG. 1), according to an embodiment of the present disclosure. The fins 202 can be formed by, for example, a photolithographic patterning and etching process that removes portions of the nanosheet stack 10 (FIG. 1) and portions of the semiconductor substrate 102. Any suitable etching process can be used such as, for example, reactive ion etching.

It should be noted that portions of the semiconductor substrate 102 removed during the photolithographic patterning process are subsequently filled to form shallow trench isolation (STI) regions, as will be described in detail below.

Figure 3:
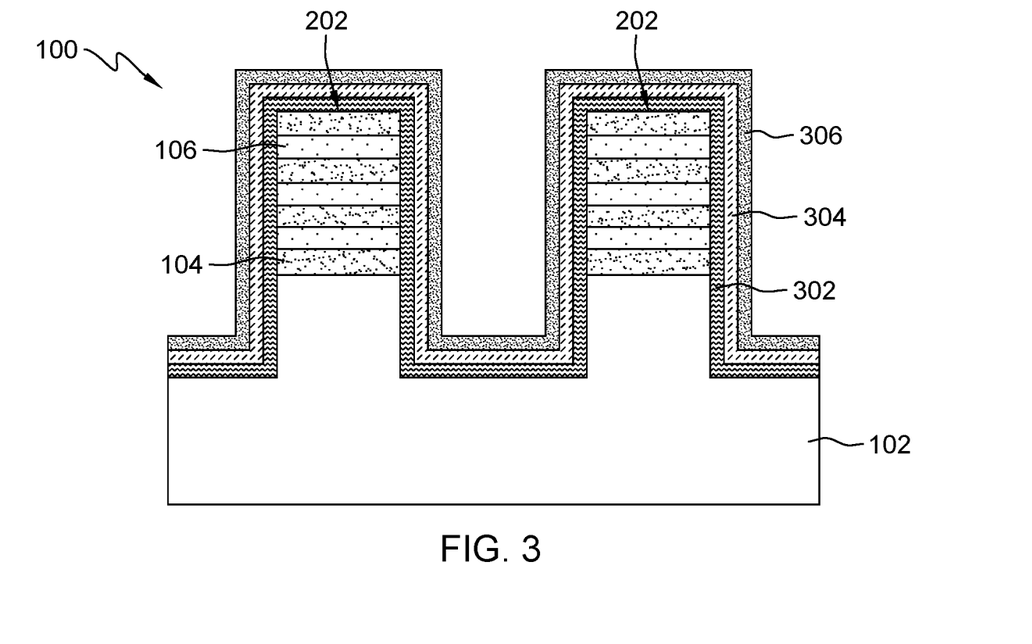
FIG. 3 is a cross-sectional view of the semiconductor structure following the deposition of a first, second, and third liner, according to an embodiment of the present disclosure.

Referring now to FIG. 3, a cross-sectional view of the semiconductor structure 100 is shown following the deposition of first liner 302, second liner 304, and third liner 306, according to an embodiment of the present disclosure.

The first liner 302 is conformally deposited above the semiconductor substrate 102, and above top and sidewalls of the fins 202. In an embodiment, the first liner 302 is deposited above and in direct contact with exposed surfaces of the semiconductor substrate 102 and the nanosheet stack 10 (FIG. 1). The first liner 302 generally includes an oxide material, such as silicon dioxide ($SiO_2$). As mentioned above, the oxide material improves an interface quality between the fins 202 and subsequently formed second and third liners 304, 306 (i.e., STI liners). Any known deposition method may be performed to form the first liner 302. For example, the first liner 302 may be deposited by using chemical vapor deposition (CVD) or atomic layer deposition (ALD). In some embodiments, the first liner 302 have a thickness of approximately 0.5 nm to approximately 10 nm, although other thicknesses are within the contemplated scope of the invention.

Following the deposition of the first liner 302, a second liner 304 is conformally deposited directly above the first liner 302. According to an embodiment, the second liner 304 includes aluminum oxide ($Al_2O_3$). As described above, aluminum oxide is known to generate a dipole effect when put in contact with oxide materials, such as the silicon dioxide material forming the underlying first liner 302. Therefore, by forming the second liner 304 between the first liner 302 and a subsequently formed nitride liner (e.g., third liner 306), the positive parasitic charges typically formed within the nitride material and at the interface between oxide and nitride materials can be counteracted or eliminated, thereby reducing sub-sheet leakage in the semiconductor structure 100.

In other embodiments, the second liner 304 may include other materials capable of generating the preferred dipole effect such as, for example, titanium oxide, hafnium oxide, zirconium oxide, or magnesium oxide.

Any known deposition method may be performed to form the second liner 304. For example, the second liner 304 may be deposited by CVD or ALD. In some embodiments, the second liner 304 may have a thickness of approximately 0.2 nm to approximately 3 nm. Preferably, the second liner 304 may have a thickness of approximately 0.5 nm to approximately 1.5 nm.

Following the deposition of the second liner 304, the third liner 306 is conformally deposited directly above the second liner 304. The third liner 306 generally includes a nitride material such as silicon nitride. As described above, the nitride material prevents silicon germanium layers from being oxidized during formation of STI regions. Any known deposition method may be performed to form the third liner 306. For example, the third liner 306 may be deposited by CVD or ALD. In some embodiments, the third liner 306 may have a thickness of approximately 1 nm to approximately 10 nm, although other thicknesses are within the contemplated scope of the invention.

It should be noted that the first liner 302, the second liner 304, and the third liner 306 together form a tri-layer STI liner with a total thickness comparable to that of conventional bi-layer (oxide-nitride) STI liners. More specifically, the addition of the second liner 304 does not affect an overall thickness of the STI liner, this is because the proposed thickness of the second liner 304 (e.g., aluminum oxide liner) is sufficient to cancel the charging effect of the nitride material forming the third liner 306. Additionally, the proposed tri-layer STI liner can be applied equally to both n-type nanosheet FETs and p-type nanosheet FETs, thereby reducing additional patterning and deposition processes generally needed to form different STI liners for n-type and p-type FETs.

Figure 4:
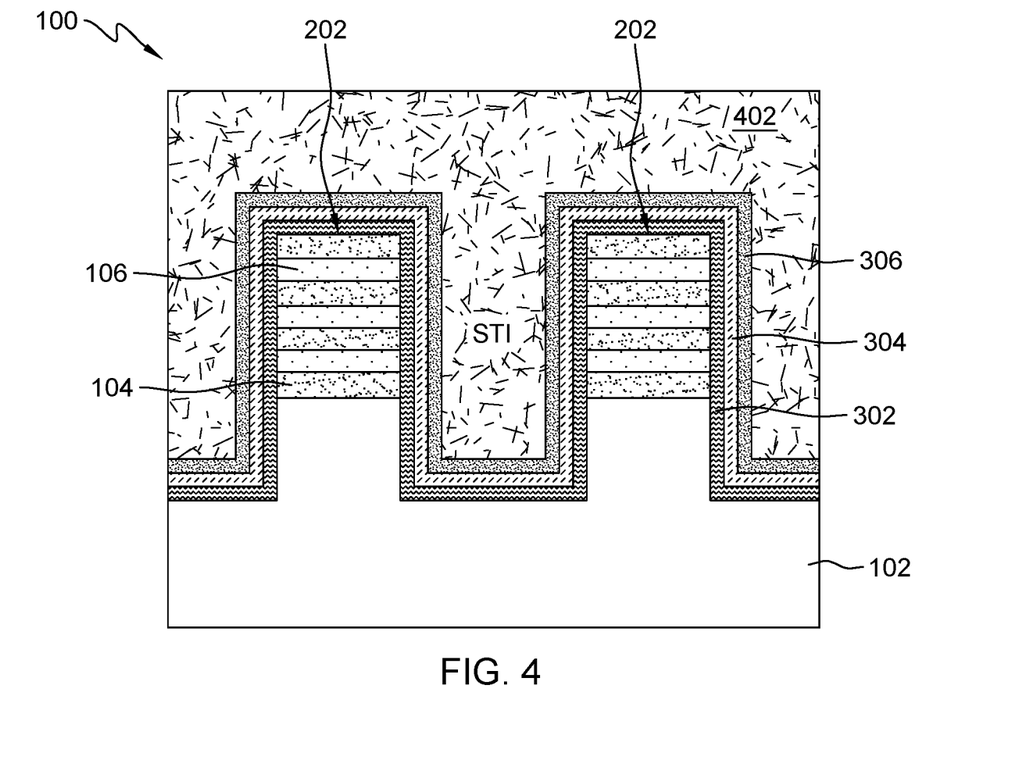
FIG. 4 is a cross-sectional view of the semiconductor structure depicting the formation of a shallow trench isolation layer, according to an embodiment of the present disclosure.

Referring now to FIG. 4, a cross-sectional view of the semiconductor structure 100 depicting the formation of a shallow trench isolation (STI) layer 402 is shown, according to an embodiment of the present disclosure.

The STI layer 402 is formed on the semiconductor structure 100 above the third liner 306. The STI layer 402 includes an insulating material that substantially fills areas of the semiconductor structure 100 between the fins 202, as shown in the figure. The STI layer 402 may be formed by, for example, CVD of a dielectric material. Non-limiting examples of dielectric materials to form the STI layer 402 include, for example, silicon oxide, silicon nitride, hydrogenated silicon carbon oxide, silicon based low-k dielectrics, flowable oxides, porous dielectrics, or organic dielectrics including porous organic dielectrics.

Figure 5:
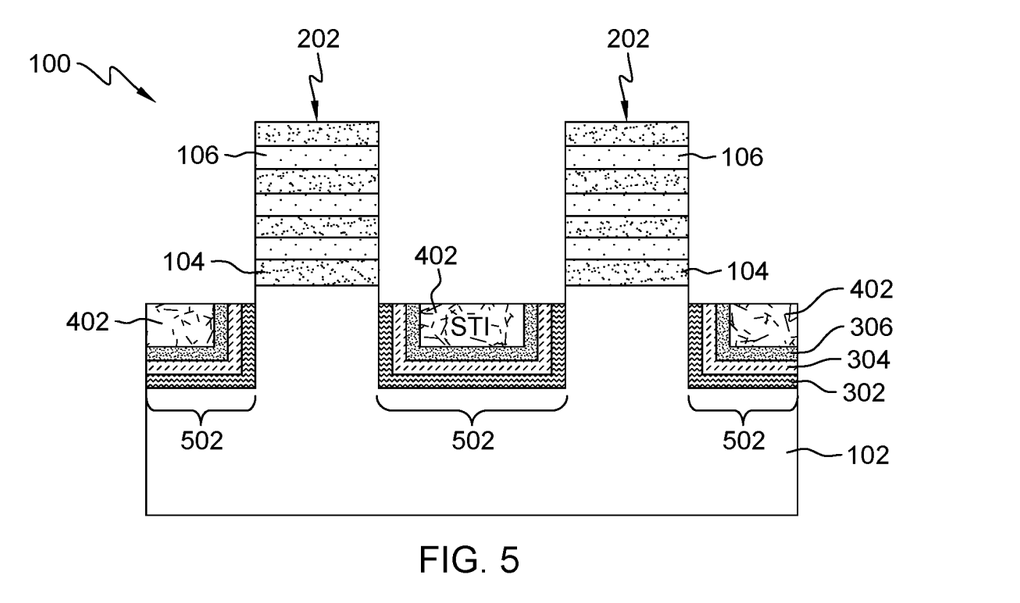
FIG. 5 is a cross-sectional view of the semiconductor structure following the formation of shallow trench isolation regions in the semiconductor substrate, according to an embodiment of the present disclosure.

Referring now to FIG. 5, a cross-sectional view of the semiconductor structure 100 is shown following the formation of STI regions 502 in the semiconductor substrate 102, according to an embodiment of the present disclosure.

After depositing the STI layer 402, a chemical mechanical polishing (CMP) process is conducted until a top surface of the fins 202 is exposed. It should be noted that the CMP process typically stops on top of a fin hard mask (not shown) positioned above the fins 202. As known by those skilled in the art, the fin hard mask (not shown) is removed during downstream processing.

The process continues with an etching technique to recess portions of the STI layer 402, the first liner 302, second liner 304, and third liner 306 from sidewalls of the fins 202, as illustrated in the figure. Specifically, portions of the STI layer 402, first liner 302, second liner 304, and third liner 306 perpendicular to the semiconductor substrate 102 are sequentially etched until exposing the fins 202. The etching process can be a dry etching or wet etching process. The term "wet etching" generally refers to application of a chemical solution. This is preferably a time controlled dip in the etch solution. Preferred wet etch solutions include $H_3PO_4$, $HNO_3$, HCl, $H_2SO_4$, HF or combinations thereof. Suitable dry etching processes can include reactive-ion-etching (RIE), ion beam etching, plasma etching, laser ablation, or the like.

Remaining portions of the STI layer 402, first liner 302, second liner 304, and third liner 306 within the semiconductor substrate 102 form the STI regions 502. The STI regions 502 isolate adjacent device regions of the semiconductor structure 100. It should be noted that in forming the STI regions 502, deposition of the STI layer 402 is performed in a way such that the insulating material can fill a high aspect ratio trench satisfactorily without voids. This is a key consideration in selecting the lateral and vertical dimension of the STI. This ability to independently shrink the horizontal isolation dimension, makes STI attractive for applications requiring high circuit density, an important objective in semiconductor design and manufacturing.

Figure 6:
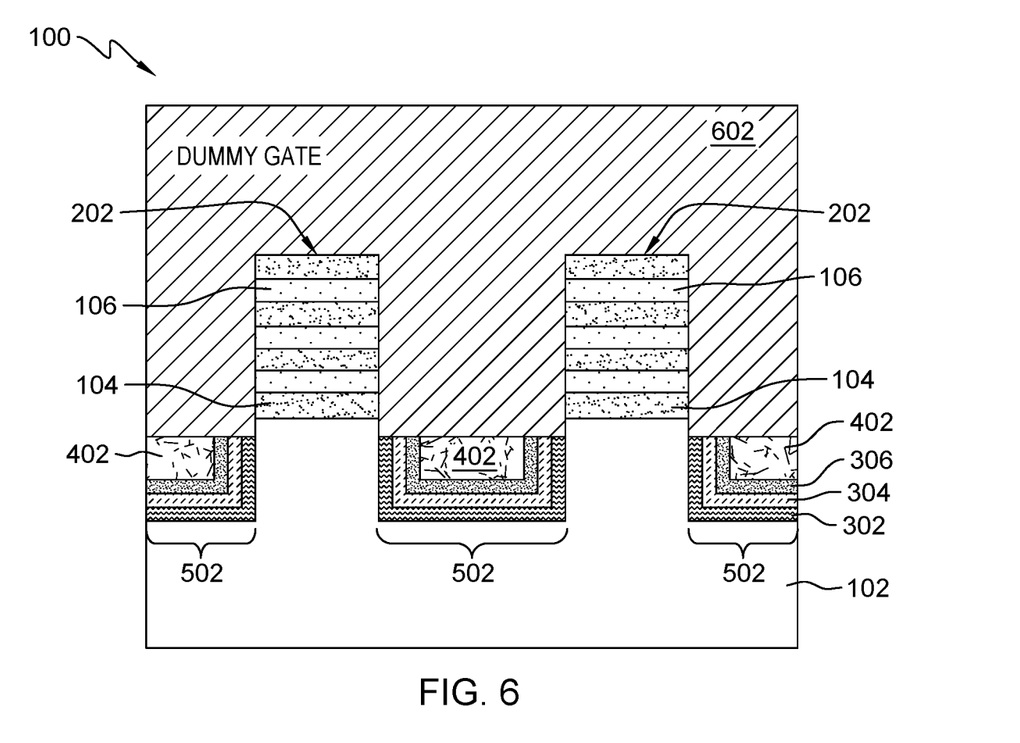
FIG. 6 is a cross-sectional view of the semiconductor structure depicting the formation of a dummy gate, according to an embodiment of the present disclosure.

Referring now to FIG. 6, a cross-sectional view of the semiconductor structure 100 depicting the formation of a dummy gate 602 is shown, according to an embodiment of the present disclosure. The dummy gate 602 is formed and patterned over tops and sidewalls of the fins 202. The dummy gate 602 may be formed using conventional techniques known in the art. For example, the dummy gate 108 may be formed from amorphous silicon (a-Si). A hard mask (not shown) is typically formed over the dummy gate 602 to act as an etch stop. The hard mask is generally formed from silicon nitride (SiN), silicon oxide, an oxide/nitride stack, or similar materials and configurations.

Figure 7:
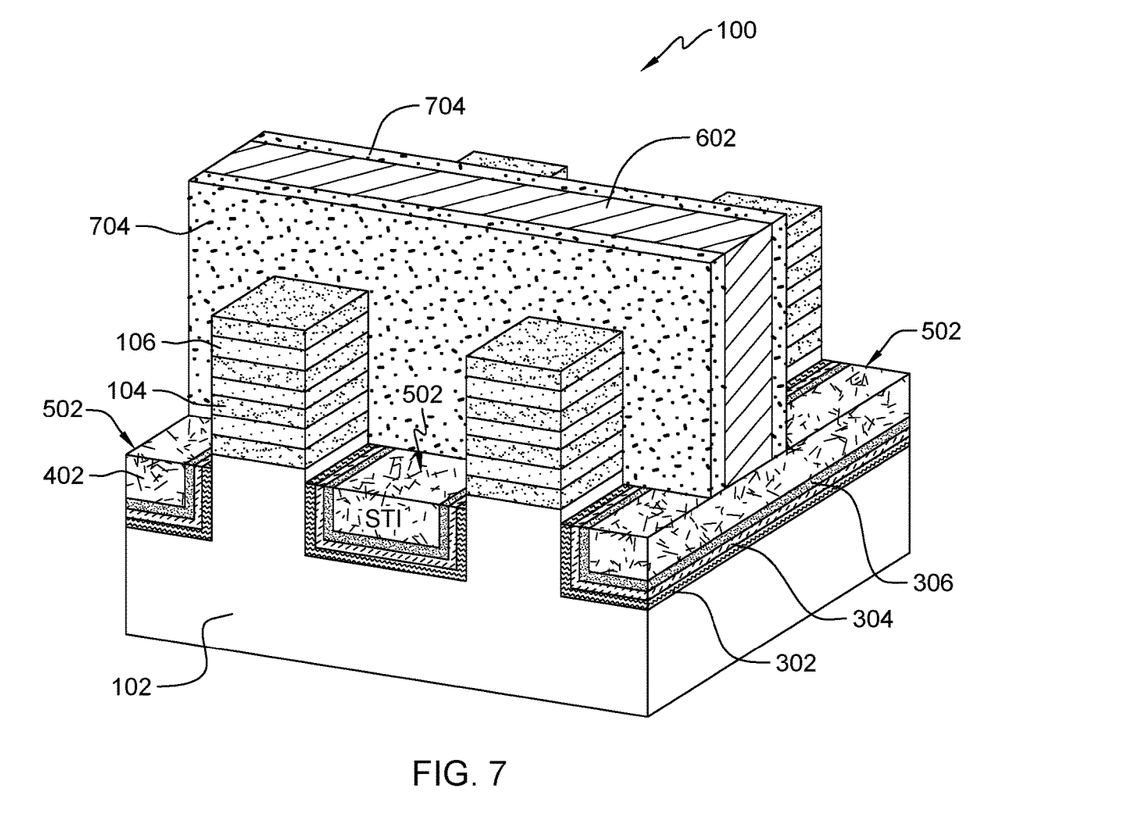
FIG. 7 is a 3D view of the semiconductor structure following the formation of offset spacers on opposite sides of the dummy gate, according to an embodiment of the present disclosure.

Referring now to FIG. 7, a 3D view of the semiconductor structure 100 following the formation of offset spacers 704 on opposite sides of the dummy gate 602, according to an embodiment of the present disclosure.

As shown in FIG. 7, offset spacers 704 are formed along sidewalls of the dummy gate 602. In an embodiment, offset spacers 704 may be formed using a spacer pull down formation process. In another embodiment, offset spacers 704 may be formed using a sidewall image transfer (SIT) spacer formation process, which includes spacer material deposition followed by directional RIE of the deposited spacer material. The width dimensions of the offset spacers 704 may vary from approximately 5 nm to approximately 15 nm.

As known by those skilled in the art, during nanosheet FET manufacturing, following the formation of the offset spacers 704, inner spacers (not shown) are formed in the semiconductor structure 100. In this process, the offset spacers 704 and a hard mask (not shown) on top of the dummy gate 108 are used as a mask to remove portions of the nanosheet stack 10 (FIG. 1) and portions of the semiconductor substrate 102 that will form source and drain regions of the FET device. A selective etching process is performed on (sacrificial) first nanosheets 104, this process creates a recess or indentation region (not shown) which is filled by isotropic deposition of an inner spacer material that pinches off the indentation region. An isotropic etching is then performed to remove excessive inner spacer material from other regions of the semiconductor structure 100.

According to an embodiment, in both n-type and p-type nanosheet FETs, the channel nanosheets are silicon (e.g., second nanosheets 106) and the sacrificial nanosheets are silicon germanium (e.g., first nanosheets 104). Forming the nanosheet stack 10 (FIG. 1) from alternating layers of channel nanosheets formed from a first type of semiconductor material and sacrificial nanosheets formed from a second type of semiconductor material provides superior channel electrostatics control, which is necessary for continuously scaling gate lengths down to 7 nm technology and beyond.

Figure 8:
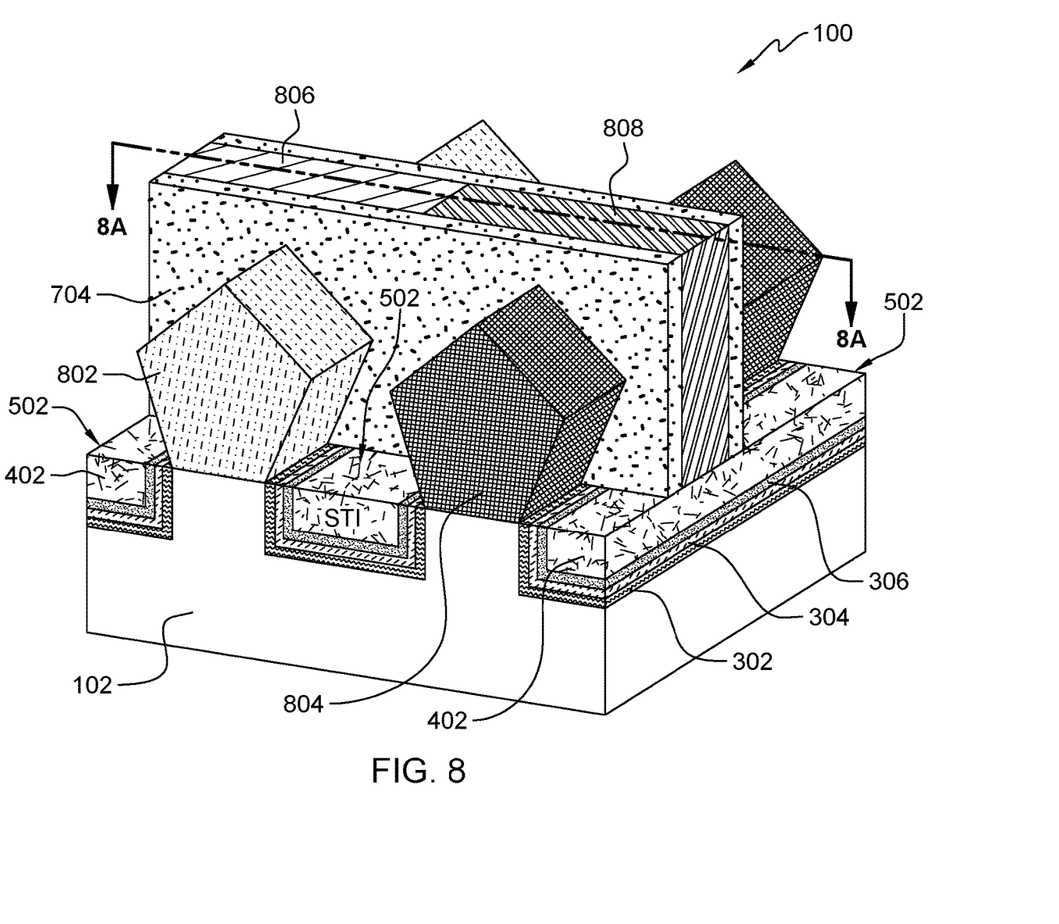
FIG. 8 is a 3D view of the semiconductor structure after forming source and drain regions and completing a replacement metal gate process, according to an embodiment of the present disclosure.
Figure 8A:
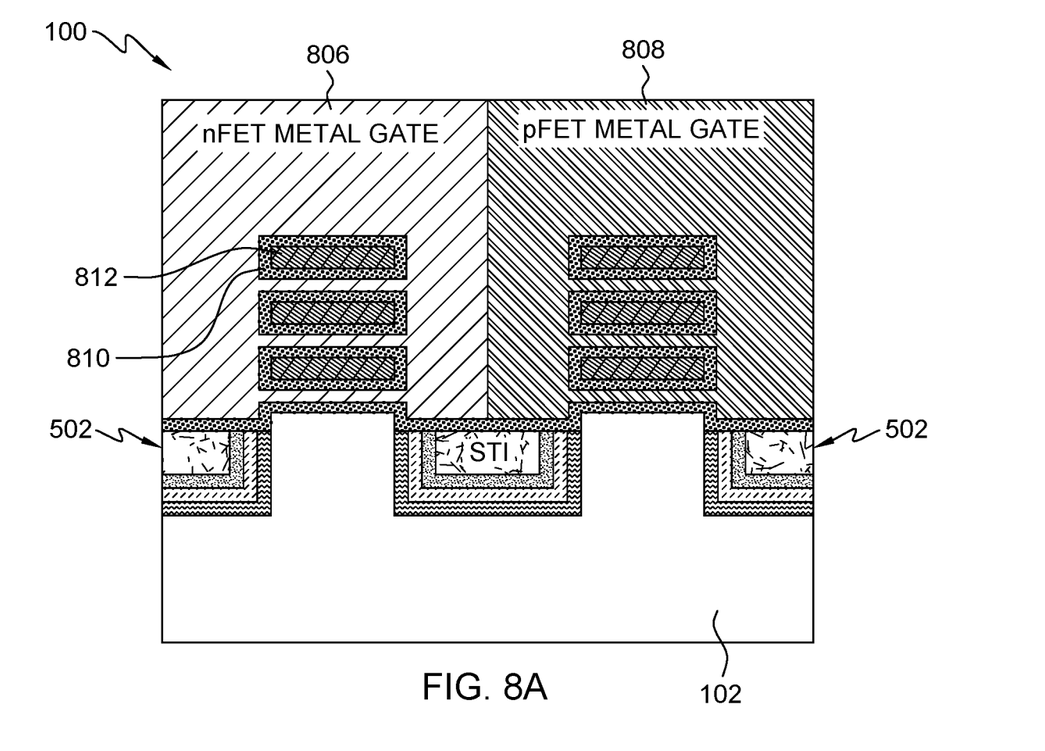
FIG. 8A is a cross-sectional view of FIG. 8 across line 8A, according to an embodiment of the present disclosure.

Referring now to FIG. 8, a 3D view of the semiconductor structure 100 after forming source and drain (S/D) regions and completing a replacement metal gate process is shown, according to an embodiment of the present disclosure. FIG. 8A is a cross-sectional view of FIG. 8 across line 8A.

In this embodiment S/D regions 802 and 804 are formed using an epitaxial layer growth process on the (opposing) exposed ends of channel nanosheets between inner spacers (not shown). In-situ doping (ISD) and/or ex-situ doping is applied to dope the S/D regions 802 and 804, thereby creating the necessary junctions of the semiconductor device. As can be appreciated in FIG. 8A, the left side of the semiconductor structure 100 is an n-type nanosheet FET (nFET) and the right side of the semiconductor structure 100 is a p-type nanosheet FET (pFET). Accordingly, the S/D regions 802 in the nFET side are doped by using n-type dopants such as, but not limited to, phosphorous and/or arsenic, while the S/D region 804 in the pFET side are doped by using p-type dopants such as, but not limited to, boron and/or gallium.

The dummy gate 602 (FIG. 7) may be removed by any known etching process such as, for example, RIE or wet chemical etching. As known by those skilled in the art, in a replacement metal gate or gate-last fabrication process, the dummy gate 602 (FIG. 7) is thereafter replaced with corresponding n-type and p-type metal gate stacks 806, 808 and metal gate dielectric stack 810 as illustrated in FIGS. 8-8A. A trench (not shown) is formed after removing the dummy gate 602 (FIG. 7). A gate dielectric stack 810 is formed within the trench. In some embodiments, the gate dielectric stack 810 (FIG. 8A) includes a layer of silicon oxide and a layer of a high-k dielectric material, such as a hafnium based material. The n-type and p-type metal gate stacks 806, 808 are deposited and patterned above the gate dielectric stack 810 to complete the gate formation. The n-type and p-type metal gate stacks 806, 808 may include one or more work function metals such as, but not limited to, titanium nitride (TiN), tantalum nitride (TaN), titanium carbide (TiC), titanium aluminum carbide (TiAlC), and conducting metals including, for example, aluminum (Al), tungsten (W) or cobalt (Co). As can be appreciated in FIG. 8A, the n-type and p-type metal gate stacks 806, 808 surround (stacked) nanosheet channels 812, this allows regulating electron flow through the nanosheet channels 812 (FIG. 8A) between the S/D regions 802 and S/D regions 804 (FIG. 8).

Therefore, embodiments of the present disclosure provide a method and related structure for reducing sub-sheet leakage in n-type nanosheet FETs. The proposed embodiments cancel or counteract positive electrical charges formed within the nitride liner and at the interface between the nitride liner and the oxide liner typically used during formation of STI regions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, the method comprising:
   etching a nanosheet stack epitaxially grown on a semiconductor substrate to form a plurality of fins;
   forming a recess within the semiconductor substrate, wherein the recess is located between adjacent fins of the plurality of fins on the semiconductor substrate;
   forming a first liner in the semiconductor structure within the recess, above top surfaces of the semiconductor substrate, and on top surfaces and sidewalls of the plurality of fins, the first liner comprising a first oxide material;
   forming a second liner directly above the first liner;
   forming a third liner directly above the second liner, the third liner comprising a nitride material,
   wherein the second liner comprises a second oxide material capable of creating a dipole effect that neutralizes positive charges generated within the third liner and between the third liner and the first liner;
   depositing a shallow trench isolation layer comprising a dielectric material directly above the third liner, the dielectric material filling a remaining space within the recess; and
   sequentially removing the dielectric material, the third liner, the second liner, and the first liner from the top surfaces and the sidewalls of the plurality of fins and from the top surfaces of the semiconductor substrate, wherein remaining portions of the dielectric material, the first liner, the second liner, and the third liner within the recess in the semiconductor substrate form a shallow trench isolation region between the adjacent fins of the plurality of fins.

2. The method of claim 1, wherein the first oxide material is silicon dioxide and the nitride material is silicon nitride.

3. The method of claim 1, wherein the second oxide material capable of creating the dipole effect comprises at least one of aluminum oxide, titanium oxide, hafnium oxide, zirconium oxide, and magnesium oxide.

4. The method of claim 1, further comprising:
   epitaxially growing the nanosheet stack on the semiconductor substrate, the nanosheet stack comprising an alternating vertical-stacked sequence of a first nanosheet comprising a first semiconductor material and a second nanosheet comprising a second semiconductor material.

5. The method of claim 4, wherein the first semiconductor material comprises silicon and the second semiconductor material comprises silicon germanium.

6. The method of claim 4, wherein the first semiconductor material comprises silicon germanium and the second semiconductor material comprises silicon.

7. The method of claim 1, further comprising:
   forming a dummy gate over the plurality of fins; and
   forming source drain regions on opposing ends of the plurality of fins not covered by the dummy gate.

8. The method of claim 7, further comprising:
   replacing the dummy gate with a metal gate.

9. The method of claim 1, wherein a thickness of the second oxide material forming the second liner is sufficient to cancel a charging effect of the nitride material forming the third liner, and wherein together the first liner, the second liner and the third liner form a tri-layer shallow trench isolation (STI) liner that can be applied to n-type nanosheet field effect transistors and p-type nanosheet field effect transistors.

\* \* \* \* \*